(12) United States Patent
Walker et al.

(10) Patent No.: US 11,669,486 B2
(45) Date of Patent: *Jun. 6, 2023

(54) INITIALIZATION SEQUENCING OF CHIPLET I/O CHANNELS WITHIN A CHIPLET SYSTEM

(71) Applicant: Micron Technology, Inc., Boise, ID (US)

(72) Inventors: Dean E. Walker, Allen, TX (US); Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/572,240

(22) Filed: Jan. 10, 2022

(65) Prior Publication Data

US 2022/0138142 A1    May 5, 2022

Related U.S. Application Data

(63) Continuation of application No. 17/075,153, filed on Oct. 20, 2020, now Pat. No. 11,294,848.

(51) Int. Cl.
*G06F 13/42* (2006.01)
*G06F 13/20* (2006.01)
*H01L 23/538* (2006.01)

(52) U.S. Cl.
CPC .......... *G06F 13/4282* (2013.01); *G06F 13/20* (2013.01); *G06F 13/423* (2013.01); *G06F 2213/0002* (2013.01); *H01L 23/538* (2013.01)

(58) Field of Classification Search
CPC ..... G06F 13/4282; G06F 13/20; G06F 13/423
See application file for complete search history.

(56) References Cited

U.S. PATENT DOCUMENTS

| | | | |
|---|---|---|---|
| 8,122,229 B2 | 2/2012 | Wallach et al. |
| 8,156,307 B2 | 4/2012 | Wallach et al. |
| 8,205,066 B2 | 6/2012 | Brewer et al. |
| 8,423,745 B1 | 4/2013 | Brewer |
| 8,561,037 B2 | 10/2013 | Brewer et al. |
| 9,710,384 B2 | 7/2017 | Wallach et al. |
| 10,990,391 B2 | 4/2021 | Brewer |

(Continued)

FOREIGN PATENT DOCUMENTS

| | | |
|---|---|---|
| CN | 114385250 A | 4/2022 |
| WO | 2010051167 | 5/2010 |

(Continued)

OTHER PUBLICATIONS

"Chinese Application Serial No. 202111211219.2, Voluntary Amendment filed Aug. 9, 2022", w/ English Claims, 27 pgs.

*Primary Examiner* — Phong H Dang
(74) *Attorney, Agent, or Firm* — Schwegman Lundberg & Woessner, P.A.

(57) ABSTRACT

A system comprises an interposer including interconnect and multiple chiplets arranged on the interposer. Each chiplet includes multiple chiplet input-output (I/O) channels interconnected to I/O channels of other chiplets by the interposer; a chiplet I/O interface for the chiplet I/O channels that includes multiple interface layers; and initialization logic circuitry configured to advance initialization of the chiplet interface sequentially through the interface layers starting with a lowest interface layer.

20 Claims, 8 Drawing Sheets

(56) References Cited

U.S. PATENT DOCUMENTS

| | | | |
|---|---|---|---|
| 10,990,392 B2 | 4/2021 | Brewer | |
| 11,294,848 B1* | 4/2022 | Walker | G06F 13/423 |
| 2006/0041696 A1 | 2/2006 | Cherukuri et al. | |
| 2008/0270708 A1 | 10/2008 | Warner et al. | |
| 2009/0265472 A1 | 10/2009 | Ayyar et al. | |
| 2012/0079177 A1 | 3/2012 | Brewer et al. | |
| 2013/0086398 A1 | 4/2013 | Khor et al. | |
| 2013/0138858 A1 | 5/2013 | Adler et al. | |
| 2013/0332711 A1 | 12/2013 | Leidel et al. | |
| 2015/0143350 A1 | 5/2015 | Brewer | |
| 2015/0206561 A1 | 7/2015 | Brewer et al. | |
| 2019/0026029 A1* | 1/2019 | Lee | G06F 3/0659 |
| 2019/0042214 A1 | 2/2019 | Brewer | |
| 2019/0044517 A1 | 2/2019 | Shumarayev et al. | |
| 2019/0171604 A1 | 6/2019 | Brewer | |
| 2019/0243700 A1* | 8/2019 | Brewer | G06F 30/394 |
| 2019/0303154 A1 | 10/2019 | Brewer | |
| 2019/0324928 A1 | 10/2019 | Brewer | |
| 2019/0340019 A1 | 11/2019 | Brewer | |
| 2019/0340020 A1 | 11/2019 | Brewer | |
| 2019/0340023 A1 | 11/2019 | Brewer | |
| 2019/0340024 A1 | 11/2019 | Brewer | |
| 2019/0340027 A1 | 11/2019 | Brewer | |
| 2019/0340035 A1 | 11/2019 | Brewer | |
| 2019/0340154 A1 | 11/2019 | Brewer | |
| 2019/0340155 A1 | 11/2019 | Brewer | |
| 2021/0055964 A1 | 2/2021 | Brewer | |
| 2021/0064374 A1 | 3/2021 | Brewer | |
| 2021/0064435 A1 | 3/2021 | Brewer | |
| 2021/0149600 A1 | 5/2021 | Brewer | |
| 2022/0012161 A1 | 4/2022 | Walker et al. | |

FOREIGN PATENT DOCUMENTS

| | | |
|---|---|---|
| WO | 2013184380 | 12/2013 |
| WO | 2019191740 | 10/2019 |
| WO | 2019191742 | 10/2019 |
| WO | 2019191744 | 10/2019 |
| WO | 2019217287 | 11/2019 |
| WO | 2019217295 | 11/2019 |
| WO | 2019217324 | 11/2019 |
| WO | 2019217326 | 11/2019 |
| WO | 2019217329 | 11/2019 |
| WO | 2019089816 | 4/2020 |

* cited by examiner

INITIALIZATION SEQUENCING OF CHIPLET I/O CHANNELS WITHIN A CHIPLET SYSTEM

PRIORITY APPLICATION

This application is a Continuation of U.S. application Ser. No. 17/075,153, filed Oct. 20, 2020, which is incorporated herein by reference in its entirety.

TECHNICAL FIELD

Embodiments of the disclosure relate generally to chiplet-based systems and more specifically to systems and methods to initialize or configure such chiplets and other components in such systems.

BACKGROUND

An SoC device can be chiplet-based and can include multiple chiplets arranged on a substrate. For different implementations it may by desired to configure input-output channels of the chiplets in different ways. One chiplet-based design may use different types of chiplets. The result may be that the chiplets of the design are not all able to be initialized by a standard method.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, various embodiments discussed in the present document.

DETAILED DESCRIPTION

Embodiments of the present disclosure are directed to initializing electronic systems that include chiplets. The system may include chiplets that each perform a different function, or the chiplets may perform the same function, but configuring multiple chiplets together (e.g., to implement parallelism of the function) results in a higher performance solution.

Figure 1A:
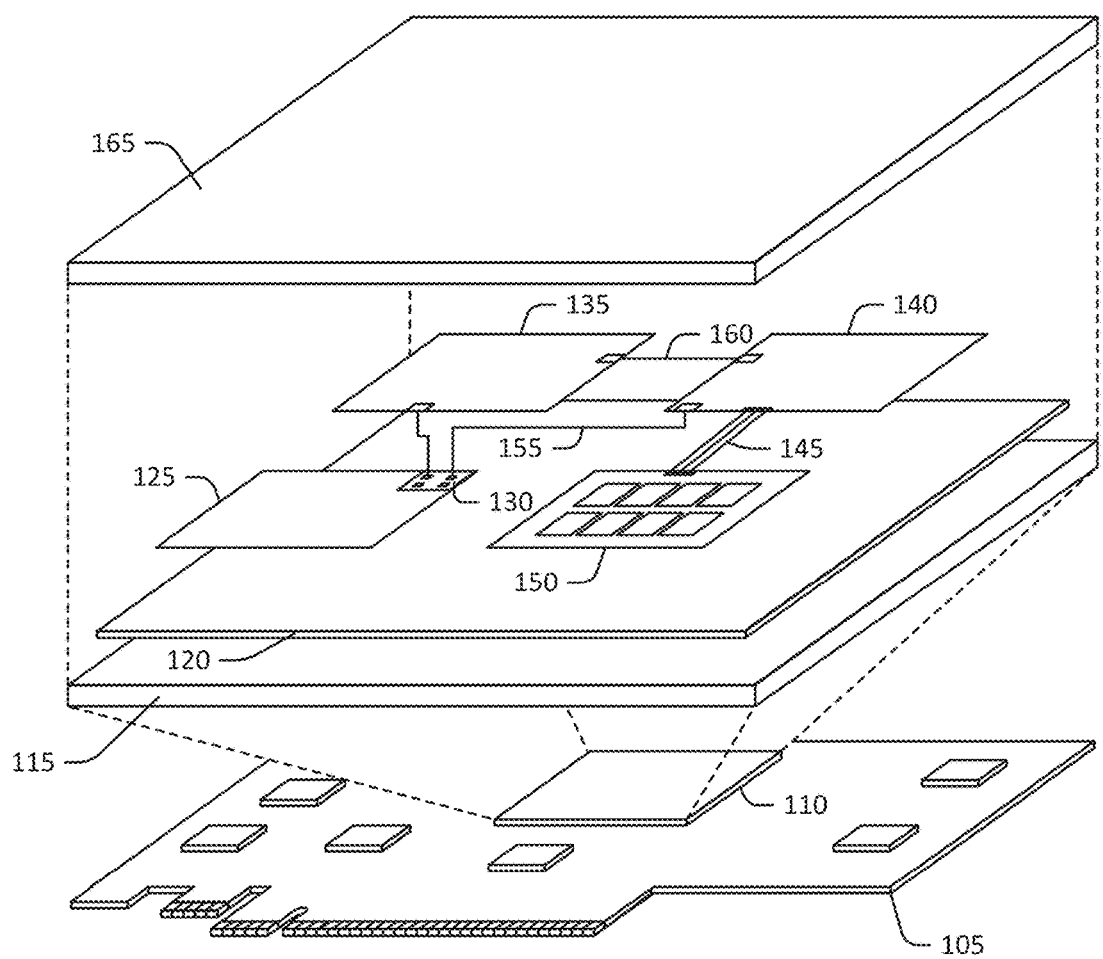
FIGS. 1A-1B illustrate an example of a chiplet-based system, in accordance with some examples described herein.
Figure 1B:
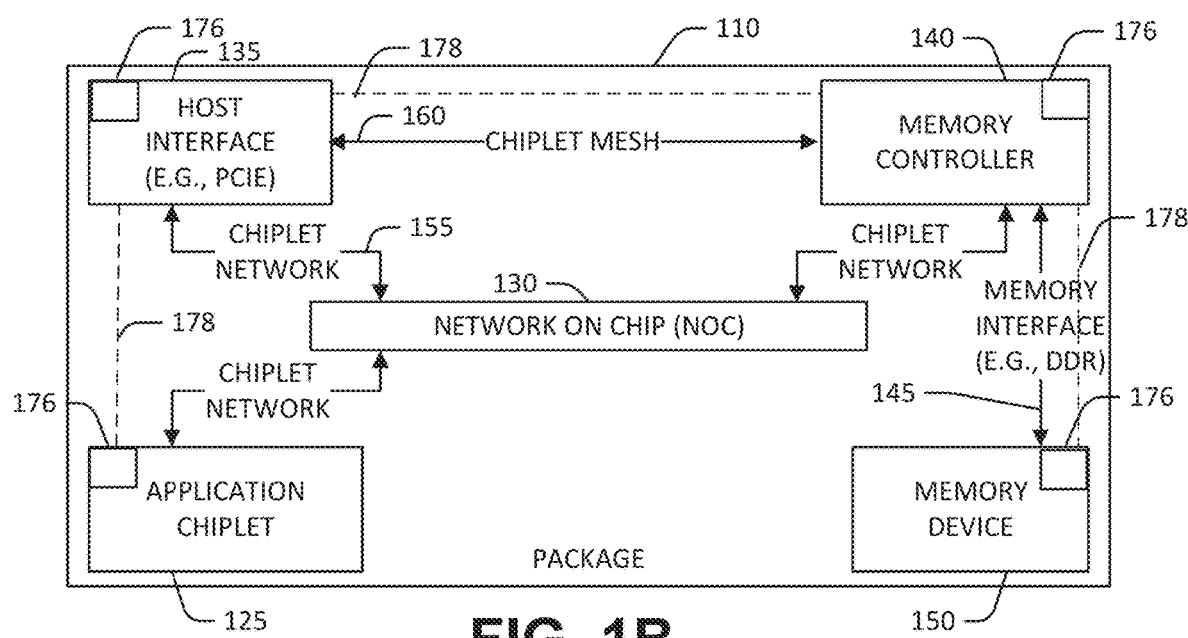

FIGS. 1A and 1B illustrate an example of a chiplet system 110. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets; an application chiplet 125, a host interface chiplet 135, a memory controller chiplet 140, and a memory device chiplet 150. The package of the chiplet system 110 is illustrated with a lid 165, though other covering techniques for the package can be used. FIG. 1B is a block diagram labeling the components in the chiplet system for clarity.

The application chiplet 125 is illustrated as including a network-on-chip (NOC) 130 to support an inter-chiplet communications network, or chiplet network 155. The NOC 130 is generally included on the application chiplet 125 because it is usually created after the support chiplets (e.g., chiplets 135, 140, and 150) are selected, thus enabling a designer to select an appropriate number of chiplet network connections or switches for the NOC 130. In an example, the NOC 130 can be located on a separate chiplet, or even within the interposer 120. In an example, the NOC 130 implements a chiplet protocol interface (CPI) network.

A CPI network is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. To achieve the flexibility of the chiplet system, CPI is used as an adapter to interface between the various AXI design options that can be used across the various chiplets. By enabling a physical channel to virtual channel mapping and encapsulating time-based signaling with a packetized protocol, CPI successfully bridges intra-chiplet networks across the chiplet network 155.

CPI can use a variety of different physical layers to transmit packets. The physical layer can include simple conductive connections or include drivers to transmit the signals over longer distances or drive greater loads. An example of one such physical layer can include the Advanced Interface Bus (AIB), implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, . . . ), and 40 bits for DDR mode: (40, 80, 120, . . . ). The AIB channel width includes both transmit and receive signals. The channel can be configured to have a symmetrical number of transmit (TX) and receive (RX) input/outputs (I/Os), or have a non-symmetrical number of transmitters and receivers (e.g., either all transmitters or all receivers). The AIB channel can act as an AIB master or slave depending on which chiplet provides the master clock. AIB I/O cells support three clocking modes: asynchronous (i.e. non-clocked), SDR, and DDR. The non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half RX and half RX. CPI packet protocols can use an AIB channel in either SDR or DDR operation modes. In an example, the AIB channel is configurable in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The interface identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary (AUX) channel that can be used for out-of-band signaling. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

In general, CPI interfaces of individual chiplets can include serialization-deserialization (SERDES) hardware. SERDES interconnects work well for scenarios in which high-speed signaling with low signal count are desirable. However, SERDES can result in additional power consumption and longer latencies for multiplexing and demultiplexing, error detection or correction (e.g., using block level cyclic redundancy checking (CRC)), link-level retry, or forward error correction. For ultra-short reach chiplet-to-chiplet interconnects where low latency or energy consumption is a primary concern, a parallel interface with clock rates that allow data transfer with minimal latency can be a better solution. CPI includes elements to minimize both latency and energy consumption in these ultra-short reach chiplet interconnects.

For flow control, CPI employs a credit-based technique. A CPI recipient, such as the application chiplet 125, provides a CPI sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the CPI recipient has twenty buffers arranged in five rows. Each buffer is sized to hold the payload of one CPI packet.

When the CPI sender transmits to the CPI recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender to transmit additional information.

Also illustrated in FIGS. 1A and 1B is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces can be used to interconnect chiplets. Some examples of a dedicate device interface include memory interface 145, and a serial peripheral interface (SPI) that includes an SPI bus 178 and SPI controllers 176. Dedicated device interfaces can be used to connect chiplets to external devices; such as the host interface chiplet 135 providing a PCIE interface external to the board 105 for the application chiplet 125. Such dedicated interfaces are generally used when a convention or standard in the industry has converged on such an interface. The illustrated example of a Double Data Rate (DDR) memory interface 145 connecting the memory controller chiplet 140 to a dynamic random access memory (DRAM) memory device chiplet 150 is an example of such an industry convention.

Of the variety of possible support chiplets, the memory controller chiplet 140 is likely present in the chiplet system 110 due to the near omnipresent use of storage for computer processing as well as a sophisticated state-of-the-art for memories. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operation execution. Maintenance operations tend to be specific to the memory device chiplet 150, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data.

Atomic operations are a data manipulation performed by the memory controller chiplet 140. For example, an atomic operation of "increment" can be specified in a command by the application chiplet 125, the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the command's success to the application chiplet 125. Atomic operations avoid transmitting the data across the chiplet network 160, resulting in lower latency execution of such commands.

Atomic operations can be classified as built-in atomics or programmable (e.g., custom) atomics. Built-in atomics are a finite set of operations that are immutably implemented in hardware. Programmable atomics are small programs that can run on a programmable atomic unit (PAU) (e.g., a custom atomic unit (CAU)) of the memory controller chiplet 140. An example of a memory controller chiplet 140 implementing a PAU is described in regard to FIG. 2.

The memory device chiplet 150 can be, or can include, any combination of volatile memory devices or non-volatile memories. Examples of volatile memory devices include, but are not limited to, random access memory (RAM), dynamic RAM (DRAM), synchronous DRAM (SDRAM), and graphics double data rate type 6 SDRAM (GDDR6 SDRAM). Examples of non-volatile memory devices include, but are not limited to, negative-and-(NAND)-type flash memory, storage class memory (e.g., phase-change memory or memristor based technologies), and ferroelectric RAM (FeRAM). The illustrated example of FIGS. 1A and 1B includes the memory device 150 as a chiplet, however, the memory device 150 can reside elsewhere, such as in a different package on the board 105.

Figure 2:
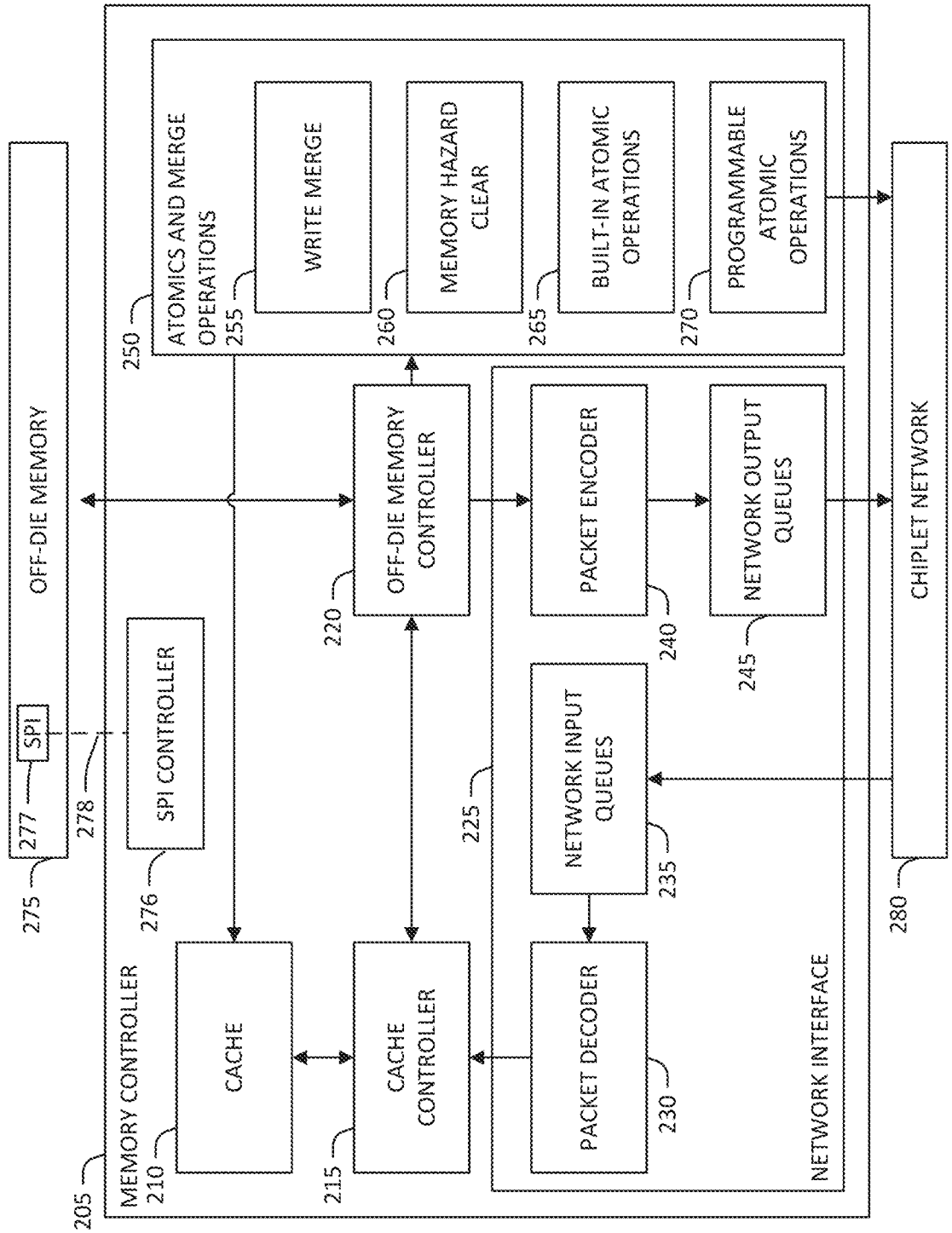
FIG. 2 is a block diagram of an example of a memory controller chiplet, in accordance with some examples described herein.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 275), a network communication interface 225 (e.g., to interface with a chiplet network 280 and communicate with other chiplets), and a set of atomic and merge operations 250. Members of this set can include a write merge unit 255, a hazard unit (260), built-in atomic unit 265, or a PAU 270. The various components are illustrated logically, and not as they necessarily would be implemented. For example, the built-in atomic unit 265 likely comprises different devices along a path to the off-die memory. In contrast, the programmable atomic operations 270 are likely implemented in a separate processor on the memory controller chiplet 205.

The off-die memory controller 220 is directly coupled to the off-die memory 275 (e.g., via a bus or other communication connection) to provide write operations and read operations to and from the off-die memory 275. The off-die memory controller 220 is also coupled for output to the atomic and merge operations unit 250, and for input to the cache controller 215 (e.g., a memory side cache controller). The memory controller 220 may also include a serial peripheral interface (SPI) controller 276 coupled to an SPI 277 of the memory device by SPI bus 278.

The cache controller 215 is directly coupled to the cache 210, and also coupled to the network communication interface 225 for input (such as incoming read or write requests) and to the off-die memory controller 220 for output.

The network communication interface 225 includes a packet decoder 230, network input queues 235, a packet encoder 240, and network output queues 245 to support a packet-based chiplet network 280 (e.g., a CPI network). The chiplet network 280 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 280 can be implemented as a collection of crossbar switches having a folded clos configuration, or a mesh network providing for additional connections, depending upon the configuration. The chiplet network 280 can be part of an asynchronous switching fabric. In this example, a data packet can be routed along any of various paths, such that the arrival of any selected data packet at an addressed destination can occur at any of a plurality of different times, depending upon the routing. The chiplet network 280 can be implemented as a synchronous communication network, such as a synchronous mesh communication network. Any and all such communication networks are considered equivalent and within the scope of the disclosure.

The memory controller chiplet 205 can receive a packet having a source address, a read request, and a physical address. In response, the off-die memory controller 220 or the cache controller 215 will read the data from the specified physical address (which can be in the off-die memory 275 or in the cache 210) and assemble a response packet to the source address containing the requested data. Similarly, the memory controller chiplet 205 can receive a packet having a source address, a write request, and a physical address. In response, the memory controller chiplet 205 will write the data to the specified physical address (which can be in the off-die memory 275 or in the cache 210) and assemble a response packet to the source address containing an acknowledgement that the data was stored to a memory.

Thus, the memory controller chiplet 205 can receive read and write requests via the chiplet network 280 and process the requests using the cache controller 215 interfacing with the cache 210. If the request cannot be handled by the cache controller 215, the off-die memory controller 220 handles the request by communication with the off-die memory 275, by the atomic and merge operations 250, or by both. Data read by the off-die memory controller 220 can be stored in the cache 210 by the cache controller 215 for later use.

The atomic and merge operations 250 are coupled to receive (as input) the output of the off-die memory controller 220, and to provide output to the cache 210, the network communication interface 225, or directly to the chiplet network 280. The memory hazard clear (reset) unit 260, write merge unit 265 and the built-in (e.g., predetermined) atomic operations unit 265 can each be implemented as state machines with other combinational logic circuitry (such as adders, shifters, comparators, AND gates, OR gates, XOR gates, or any suitable combination thereof) or other logic circuitry. These components can also include one or more registers or buffers to store operand or other data. The PAU 270 can be implemented as one or more processor cores or control circuitry, and various state machines with other combinational logic circuitry or other logic circuitry, and can also include one or more registers, buffers, or memories to store addresses, executable instructions, operand and other data, or can be implemented as a processor.

The write merge unit 255 receives read data and request data, and merges the request data and read data to create a single unit having the read data and the source address to be used in the response or return data packet). The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 280.

When the request data is for a built-in atomic operation, the built-in atomic operations unit 265 receives the request and read data, either from the write merge unit 265 or directly from the off-die memory controller 220. The atomic operation is performed, and using the write merge unit 255, the resulting data is written to the cache 210, or provided to the network communication interface 225 to encode and prepare a response or return data packet for transmission on the chiplet network 280.

The built-in atomic operations unit 265 handles predefined atomic operations such as fetch-and-increment or compare-and-swap. In an example, these operations perform a simple read-modify-write operation to a single memory location of 32-bytes or less in size. Atomic memory operations are initiated from a request packet transmitted over the chiplet network 280. The request packet has a physical address, atomic operator type, operand size, and optionally up to 32-bytes of data. The atomic operation performs the read-modify-write to a cache memory line of the cache 210, filling the cache memory if necessary. The atomic operator response can be a simple completion response, or a response with up to 32-bytes of data. Example atomic memory operators include fetch-and-AND, fetch-and-OR, fetch-and-XOR, fetch-and-add, fetch-and-subtract, fetch-and-increment, fetch-and-decrement, fetch-and-minimum, fetch-and-maximum, fetch-and-swap, and compare-and-swap. In various example embodiments, 32-bit and 64-bit operations are supported, along with operations on 16 or 32 bytes of data. Methods disclosed herein are also compatible with hardware supporting larger or smaller operations and more or less data.

Built-in atomic operations can also involve requests for a "standard" atomic operation on the requested data, such as a comparatively simple, single cycle, integer atomics (e.g., fetch-and-increment or compare-and-swap), which will occur with the same throughput as a regular memory read or write operation not involving an atomic operation. For these operations, the cache controller 215 generally reserves a cache line in the cache 210 by setting a hazard bit (in hardware), so that the cache line cannot be read by another process while it is in transition. The data is obtained from either the off-die memory 275 or the cache 210, and is provided to the built-in atomic operation unit 265 to perform the requested atomic operation. Following the atomic operation, in addition to providing the resulting data to the data packet encoder 240 to encode outgoing data packets for transmission on the chiplet network 280, the built-in atomic operation unit 265 provides the resulting data to the write merge unit 255, which will also write the resulting data to the cache circuit 210. Following the writing of the resulting data to the cache 210, any corresponding hazard bit which was set will be cleared by the memory hazard clear unit 260.

The PAU 270 enables high performance (high throughput and low latency) for programmable atomic operations (also referred to as "custom atomic operations"), comparable to the performance of built-in atomic operations. Rather than executing multiple memory accesses, in response to an atomic operation request designating a programmable atomic operation and a memory address, circuitry in the memory controller chiplet 205 transfers the atomic operation request to PAU 270 and sets a hazard bit stored in a memory hazard register corresponding to the memory address of the memory line used in the atomic operation, to ensure that no other operation (read, write, or atomic) is performed on that memory line. The hazard bit is then cleared upon completion of the atomic operation. Additional direct data paths provided for the PAU 270 to execute the programmable atomic operations allow for additional write operations without any limitations imposed by the bandwidth of the communication networks and without increasing any congestion of the communication networks.

The PAU 270 include a RISC-V instruction set architecture (RISC-V ISA) based multi-threaded processor having one or more processor cores, and may further have an extended instruction set for executing programmable atomic operations. When provided with the extended instruction set for executing programmable atomic operations, the PAU 270 can be embodied as one or more hybrid threading processors. In some example embodiments, the PAU 270 provides barrel-style, round-robin instantaneous thread switching to maintain a high instruction-per-clock rate.

Programmable atomic operations can be performed by the PAU 270 that involve requests for a programmable atomic operation on the requested data. A user can prepare programming code to provide such programmable atomic operations. For example, the programmable atomic operations can be comparatively simple, multi-cycle operations such as floating-point addition, or comparatively complex, multi-instruction operations such as a Bloom filter insert. The programmable atomic operations can be the same as or different than the predetermined atomic operations, insofar as they are defined by the user rather than a system vendor. For these operations, the cache controller 215 can reserve a cache line in the cache 210, by setting a hazard bit (in hardware), so that cache line cannot be read by another process while it is in transition. The data is obtained from either the off-die memory 275 or the cache 210, and is provided to the PAU 270 to perform the requested programmable atomic operation. Following the atomic operation, the PAU 270 will provide the resulting data to the network communication interface 225 to directly encode outgoing data packets having the resulting data for transmission on the chiplet network 280. In addition, the PAU 270 will provide the resulting data to the cache controller 215, which will also write the resulting data to the cache 210. Following the writing of the resulting data to the cache 210, any corresponding hazard bit which was set will be cleared by the cache control circuit 215.

The approach taken for programmable atomic operations is to provide multiple, generic, custom atomic request types that can be sent through the chiplet network 280 to the memory controller chiplet 205 from an originating source such as a processor or other system component. The cache controller 215 and off-die memory controller 220 identify the request as a custom atomic request and forward the request to the PAU 270. In a representative embodiment, the PAU 270: (1) is a programmable processing element capable of efficiently performing a user defined atomic operation; (2) can perform load and stores to memory, arithmetic and logical operations and control flow decisions; and (3) can leverage the RISC-V ISA with a set of new, specialized instructions to facilitate interacting with the first and cache controllers 215, 220 to atomically perform the user-defined operation. It should be noted that the RISC-V ISA contains a full set of instructions that support high level language operators and data types. The PAU 270 can leverage the RISC-V ISA, but generally supports a more limited set of instructions and limited register file size to reduce the die size of the unit when included within the memory controller chiplet 205.

As mentioned above, any hazard bit which is set will be cleared by the memory hazard clear unit 260. Prior to the writing of the read data to the cache 210, a set hazard bit for the reserved cache line is to be cleared by the memory hazard clear unit 260. Accordingly, when the request and read data is received by the write merge unit 255, a reset or clear signal can be transmitted by the memory hazard clear unit 260 to the cache 210 to reset the set memory hazard bit for the reserved cache line. Also, resetting this hazard bit will also release a pending read or write request involving the designated (or reserved) cache line, providing the pending read or write request to an inbound request multiplexer for selection and processing.

Figure 3:
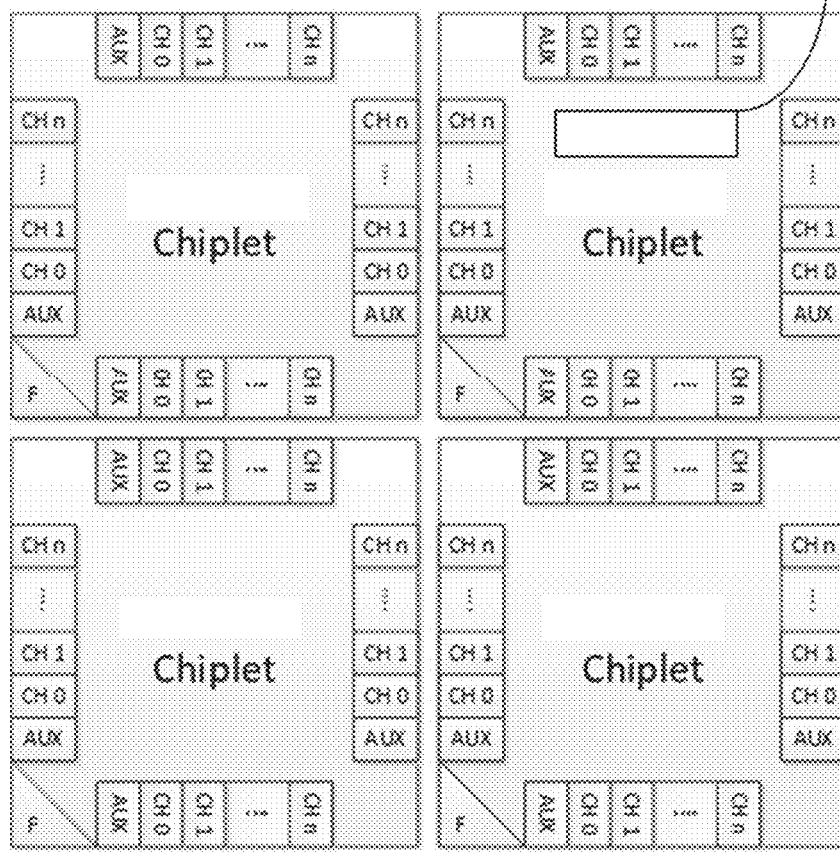
FIG. 3 is a block diagram illustrating an example embodiment of a chiplet-based system on chip, in accordance with some examples described herein.

FIG. 3 is a block diagram illustrating an example of a chiplet-based system 310 including four chiplets (e.g., an application chiplet, a host interface chiplet, a memory controller chiplet, and a memory device chiplet). Other implementations may include more chiplets. The chiplets of the system may be arranged in a tightly packed matrix to create a higher performance functional block in a minimum footprint. To facilitate communication among the chiplets, the chiplets include multiple input-output (I/O) channels (e.g., AIB channels), shown in FIG. 3 arranged in columns of channels at the periphery of the chiplets. The I/O channels typically are configured for a design. For example, the I/O channels of chiplets may be configured as receive (RX) channels, transmit (TX) channels, or a mix of RX/TX channels.

However, not all of the chiplets designs may have the same type of initialization. Individual chiplets may only support a hardware-based initialization option for the I/O channels, or only a software-based initialization option for the I/O channels. Because a chiplet-based system may include different chiplet designs mixed in the same system, without a standard method to support both hardware-based and software-based approaches, each system would need an individual ad hoc hardware or software-based initialization method. This could result in some I/O channels of the chiplets not being interoperable with other I/O channels of the chiplets.

A standardized method of initialization of the I/O channels of the chiplets is described herein that allows all chiplets of the multi-chiplet I/O interface to be interoperable within a single system. The standardized method can be used for both hardware-based and software-based initialization mechanisms to guarantee interoperability of the interconnected chiplet I/O channels.

Figure 4:
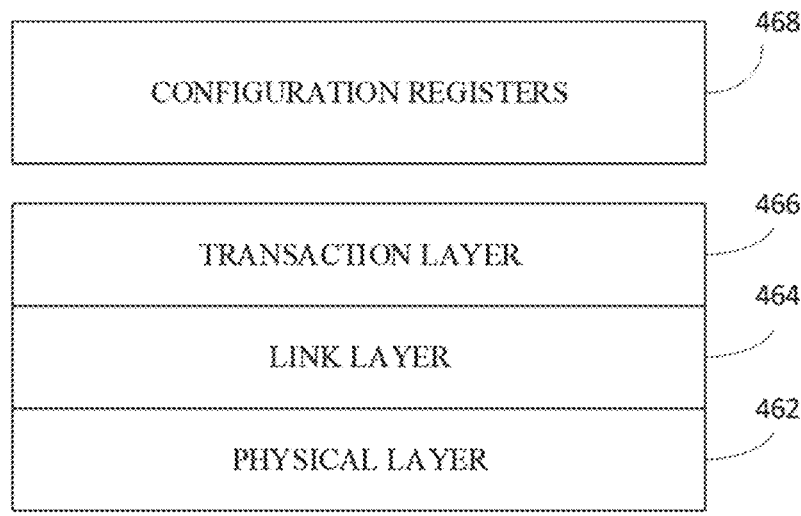
FIG. 4 is a block diagram of interface layers of a chiplet input-output interface, in accordance with some examples described herein.

FIG. 4 is a block diagram of interface layers of a chiplet I/O interface. The interface layers include a physical layer 462, a link layer 464, and a transaction layer 466. The physical layer is the lowest layer of the chiplet I/O interface. The physical layer 462 may define the pinout of the I/O channel of a chiplet. For example, the initialization process may configure the pinout as RX only, TX only, or a combination of RX and TX. The link layer 464 may include a medium access control (MAC) sublayer and a logical link control sublayer. The link layer 464 may perform flow control over the physical layer 462 and may be responsible for error control and line protocol control. The transaction layer 466 may can include network and transport sublayers. The transaction layer 466 generates outbound transaction layer packets (TLPs) and receives inbound TLPs.

If a chiplet supports a software-based initialization mechanism, the chiplet I/O interface may also include one or more configuration registers to configure the interface layers. To initialize the I/O channels of the chiplet, configuration data is written to one or more configuration registers 468 of the chiplet. The chiplet may have a configuration register for each column of the chiplet, or the chiplet may have a configuration register for each I/O channel of the chiplet. If a chiplet supports a hardware-based initialization mechanism, the configuration of the interface layers is static and the configuration may be defined by hard coding in the hardware.

Returning to FIG. 3, one or more chiplets of the system may include initialization logic circuitry 370 to advance the chiplet I/O interface through multiple stages or phases of the initialization. The chiplets may include an additional communication interface between chiplets and the configuration data is communicated among the chiplets using the communication interface. In an example, the communication interface may be a dedicated interface such as an SPI. An SPI bus includes four signals: a serial clock (SCLK), a master output slave input (MOSI), a master input slave output (MISO), and slave select (SS). During each clock cycle of SCLK data may transmitted to shift data into registers of the chiplets using the MOSI and MISO lines.

The initialization logic circuitry 370 advances initialization of the chiplet interface sequentially through the interface layers starting with the lowest interface layer (e.g., the physical layer). The initialization may advance through multiple initialization phases with one interface layer initialized during each phase by writing initialization data to the chiplet I/O channels during each initialization phase.

Figure 5:
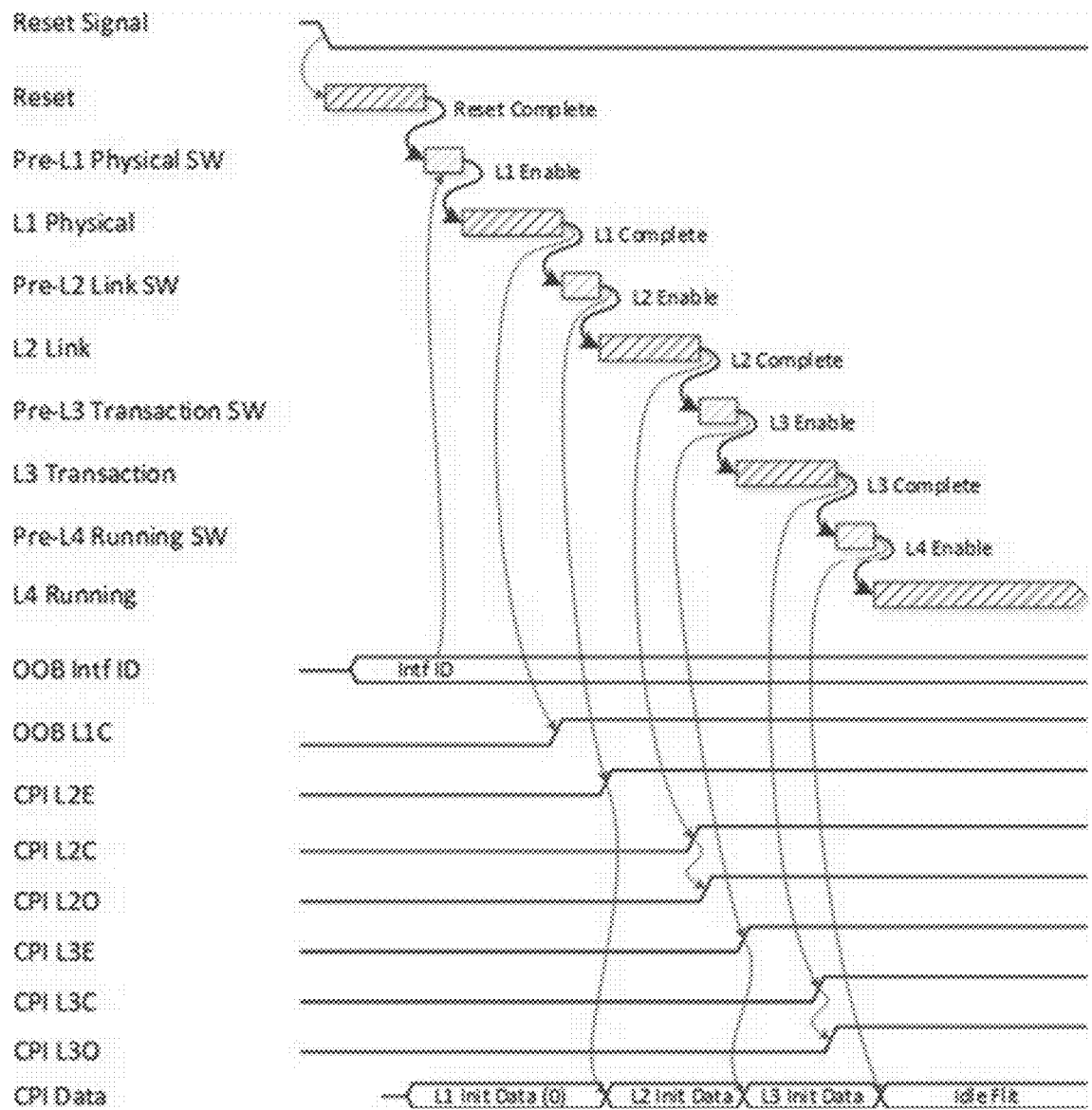
FIG. 5 is a timing diagram of initialization of the input-output channel interface of the chiplets of a system on chip, in accordance with some examples described herein.

FIG. 5 is a timing diagram of initialization of the I/O channel interface of the chiplets of a chiplet-based system. The initialization process includes interlocked initialization phases labeled L1 through L4. The initialization may begin after completion of Reset of the system. The first phase L1 initializes the physical layer, the second phase L2 initializes the link layer, the third phase L3 initializes the transaction layer, and the last phase L4 is a transition of the I/O channel interface to a running state. An interface identifier (Intf ID) may be transmitted serially using a physical layer and out of band (OOB) signaling to identify the interface being initialized.

Each initialization phase begins with an assertion of the phase's enable signal and completes with the assertion of the phase's completion signal. During a configuration state between the time of the assertion of the phase enable and assertion of the phase complete signal for the L1, L2, and L3 phases, initialization data is loaded into the I/O channels for the physical layer, the link layer, and the transaction layer, respectively. For a software initialized chiplet, initialization data is written to one or more configuration registers of the layers. In the example FIG. 5, the channel interface is shown transmitting an Idle Flit when the channel interface enters phase L4.

The sequencing of the phases can be completely controlled by hardware circuits or can by controlled by software. Some chiplets of the system may be hardware sequenced and some chiplets may be software sequenced. In a hardware sequenced implementation, the initialization logic circuitry advances to the configuration state of the phase in response to the phase enable signal. The initialization data may be configured in the hardware. For example, the initialization data may be strapped at the input ports during design of the system. During the configuration state, initialization data is loaded into the one or more configuration registers of the I/O channels. The phase complete signal for the phase is generated in response to the initialization data being written into the one or more configuration registers of the I/O channels. The enable signal for the next phase of the sequence is enabled in response to the phase complete signal.

In a software sequenced implementation, the sequencing of the phases is driven using one or more software accessible control registers and status registers of the chiplet I/O interface. The control register may include an L1 Enable field to enable initialization of the physical layer, an L2 Enable field to enable initialization of the link layer, an L3 Enable field to enable initialization of the transaction layer, and an L4 Enable field to enable the running state of the interface. The status register may include an L1 Complete field to indicate completion of the initialization of the physical layer, an L2 Complete field to indicate completion of the initialization of the link layer, an L3 Complete field to indicate completion of the initialization of the transaction layer, and an L4 Complete field to indicate transition to the running state is complete.

For a software sequenced implementation, one of the chiplets may be a master chiplet that advances the sequencing by writing and reading the status registers, or control logic to advance the sequencing may be included external to the system. Writing the phase enable of the control register advances a phase to the configuration state. Configuration or initialization data to be written to the chiplets may be made available by the master chiplet or the external control logic. The configuration or initialization data can be included in one or more configuration registers written using an SPI. When a phase complete status is detected in the status register, the phase sequence is advanced by writing the control register to assert the enable of the next phase. The configuration data may have to be made available prior to enabling the phase by writing the control register.

In the example of FIG. 5, for either the hardware or software sequenced implementation, the L1 physical layer enable is asserted after Reset is complete. Physical layer initialization data (L1 Init Data) is written and the L1 completion status is asserted. The L1 completion status may be communicated among the chiplets of the system using out-of-band signaling between chiplets and the initialization data may be sent as CPI data. The L2 enable is then asserted to start the L2 initialization phase. Once the L2 link layer enable is asserted, each end of the link between chiplets begins driving the L2 pattern onto the link between chiplets with the L2 enable (L2E) signal asserted. The L2 pattern can be an interface flit communicated among the chiplets using the CPI.

Figure 6:
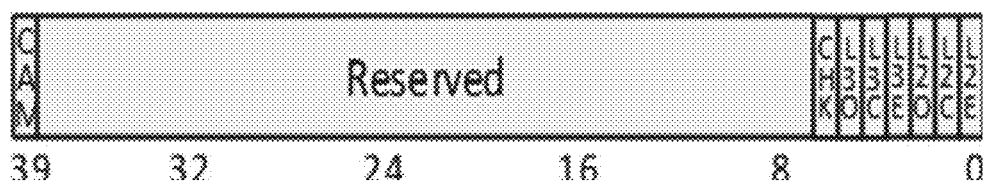
FIG. 6 is a diagram of an example of an interface flit that can be communicated between the chiplets during the initialization phase, in accordance with some examples described herein.

FIG. 6 is a diagram of an example of an interface flit that can be used during the L2 and L3 phases to pass the L2 signals (L2E, L2C, L2O) and the L3 signals (L3E, L3C, L3O) between the chiplets. When link layer initialization data (L2 Init Data) is written and the L2 link layer initialization is completed at each end of the chiplet link, each end of the link drives the L2 pattern with the L2C signal asserted. When an opposite end receives the L2C signal, it reflects that status by driving the L2 pattern with the L2O signal asserted.

When both the L2C and L2O interface signals are asserted, the L2 link layer initialization phase has completed and the L2 link layer phase completion signal is asserted. This phase completion signal may either enable the L3 phase in the hardware sequenced implementations, or the phase completion signal will be indicated in a status register to make the signal accessible for software sequenced implementations. This allows a software sequenced implementation to perform any configuration of endpoints before enabling the L3 transaction layer initialization phase.

Once the L3 transaction layer is asserted, each end of the link begins driving the L3 pattern onto the link between chiplets with the L3 enable (L3E) signal asserted. The L3 pattern can be an interface flit communicated among the chiplets. When transaction layer initialization data (L3 Init Data) is written and the L3 link layer initialization is completed at each end of the chiplet link, each end of the link drives the L3 pattern with the L3C signal asserted. When an opposite link end receives the L3C signal, it reflects that status by diving the L3 pattern with the L3O signal asserted. When both the L3C and L3O interface signals are asserted, the L3 transaction layer initialization phase has completed and the L3 transaction layer phase completion signal is asserted.

This phase completion signal may either enable the L4 running state in the hardware sequenced implementations or the phase completion signal will be indicated in a status register to make the signal accessible for software sequenced implementations. This allows a software sequenced implementation to perform any configuration of endpoints before enabling the L4 running state. Once the L4 running state is asserted, each chiplet starts forwarding valid protocol flits from its chiplet source across the link. FIG. 4 shows an Idle Flit being transmit during the L4 running state.

Figure 7:
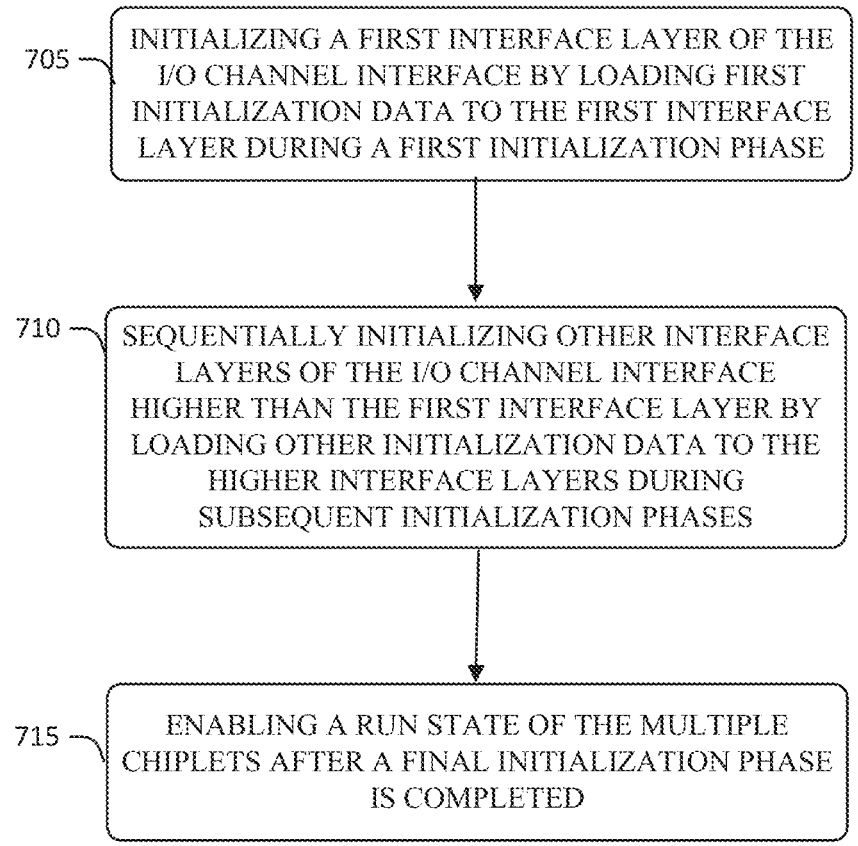
FIG. 7 is a flow diagram of an example of a method to initialize an input-output channel interface of chiplets of a system on chip, in accordance with some examples described herein.

FIG. 7 is a flow diagram of an example of a method 700 performed by a circuit or system to initialize an I/O channel interface of multiple chiplets of a chiplet-based system. At 705, a first interface layer of the I/O channel interface is initialized by loading first initialization data to the first interface layer during a first initialization phase. The first layer may be a physical layer of the I/O channel interface.

At 710, the interface layers of the I/O channel interface higher than the first interface layer are sequentially initialized by loading other initialization data to the higher interface layers during subsequent initialization phases. The subsequent layers can include a link layer and a transaction layer of the I/O channel interface.

At 715, a run state of the chiplets is enabled after a final initialization phase is completed. When in the run state, the chiplets may transmit packets or flits of data according to a protocol using the I/O channels of the I/O channel interface.

Figure 8:
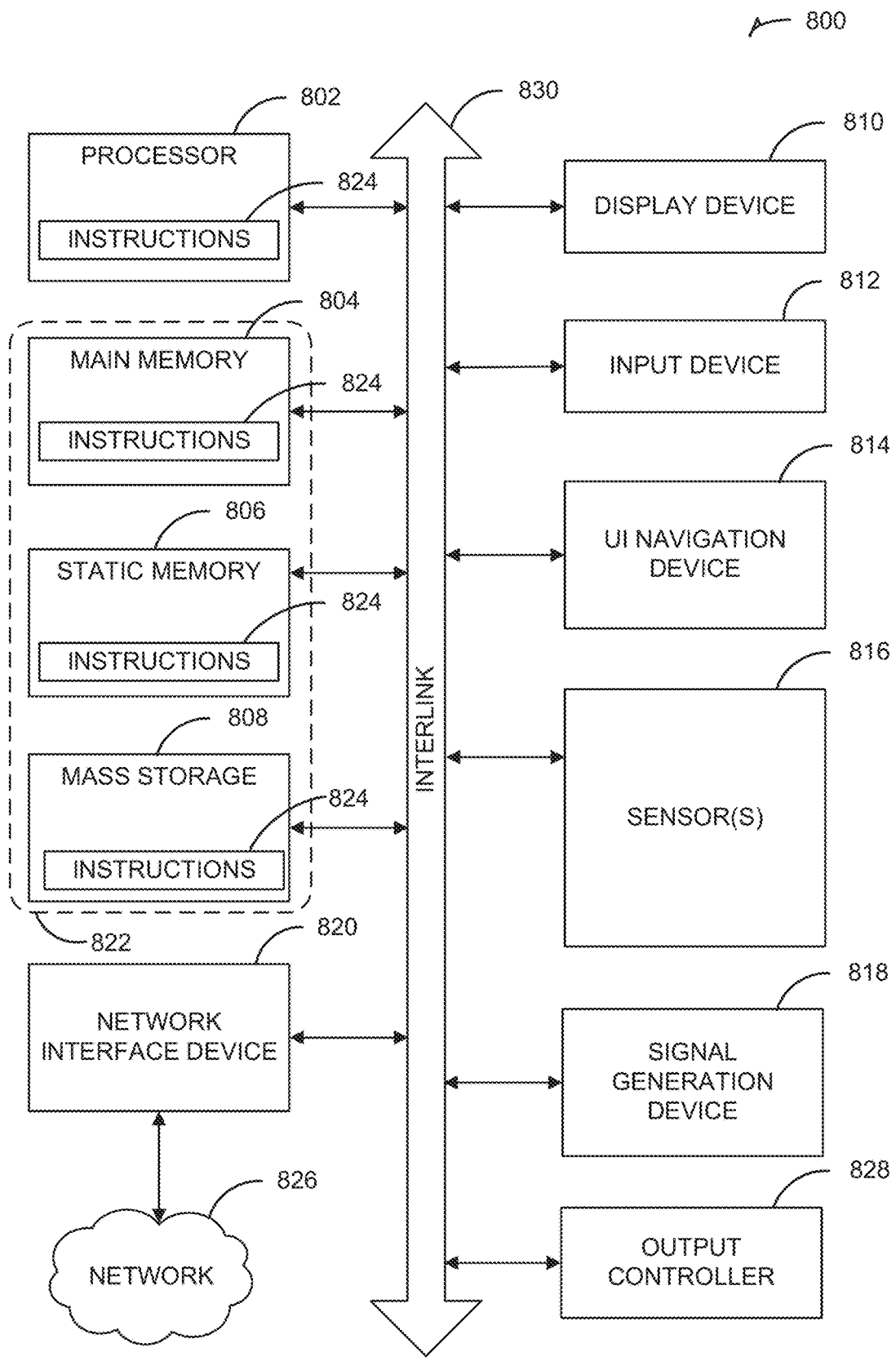
FIG. 8 is a block diagram of an example machine upon which any one or more of the techniques or methodologies described herein may be performed.

FIG. 8 illustrates a block diagram of an example machine 800 upon which any one or more of the techniques (e.g., methodologies) described herein may be performed. Examples, as described herein, may include, or may operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 800 follow.

In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 800 may include a hardware processor 802 (e.g., a central processing unit (CPU), a graphics processing unit (GPU), a hardware processor core, or any combination thereof), a main memory 804, a static memory (e.g., memory or storage for firmware, microcode, a basic-input-output (BIOS), unified extensible firmware interface (UEFI), etc.) 806, and mass storage 808 (e.g., hard drives, tape drives, flash storage, or other block devices) some or all of which may communicate with each other via an interlink (e.g., bus) 830. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 808, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 802, the main memory 804, the static memory 806, or the mass storage 808 may be, or include, a machine readable medium 822 on which is stored one or more sets of data structures or instructions 824 (e.g., software) embodying or utilized by any one or more of the techniques or functions described herein. The instructions 824 may also reside, completely or at least partially, within any of registers of the processor 802, the main memory 804, the static memory 806, or the mass storage 808 during execution thereof by the machine 800. In an example, one or any combination of the hardware processor 802, the main memory 804, the static memory 806, or the mass storage 808 may constitute the machine-readable media 822. While the machine-readable medium 822 is illustrated as a single medium, the term "machine readable medium" may include a single medium or multiple media (e.g., a centralized or distributed database, and/or associated caches and servers) configured to store the one or more instructions 824.

The term "machine-readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine-readable medium examples may include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 822 may be representative of the instructions 824, such as instructions 824 themselves or a format from which the instructions 824 may be derived. This format from which the instructions 824 may be derived may include source code, encoded instructions (e.g., in compressed or encrypted form), packaged instructions (e.g., split into multiple packages), or the like. The information representative of the instructions 824 in the machine readable medium 822 may be processed by processing circuitry into the instructions to implement any of the operations discussed herein. For example, deriving the instructions 824 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 may include assembly, compilation, or interpretation of the information (e.g., by the processing circuitry) to create the instructions 824 from some intermediate or preprocessed format provided by the machine readable medium 822. The information, when provided in multiple parts, may be combined, unpacked, and modified to create the instructions 824. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 824 may be further transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

In the foregoing specification, some example implementations of the disclosure have been described. It will be evident that various modifications can be made thereto without departing from the broader scope and spirit of the disclosure as set forth in the following claims. The specification and drawings are, accordingly, to be regarded in an illustrative sense rather than in a restrictive sense. Below is a non-exhaustive list of examples of implementations of the present disclosure.

Example 1 can include subject matter (such as a system) comprising an interposer including at least one interconnect bus and multiple chiplets arranged on the interposer. Each chiplet includes multiple chiplet input-output (I/O) channels interconnected to I/O channels of other chiplets through the interposer, a chiplet I/O interface for the chiplet I/O channels that includes multiple interface layers, and initialization logic circuitry configured to advance initialization of the chiplet interface sequentially through the interface layers starting with a lowest interface layer.

In Example 2, the subject matter of Example 1 optionally includes initialization logic circuitry configured to advance through multiple initialization phases with one interface layer of the chiplet I/O interface initialized by writing initialization data to the chiplet I/O channels during each initialization phase.

In Example 3, the subject matter of Example 2 optionally includes interface layers of the chiplet I/O interface that include a physical layer, a link layer, and a transaction layer, and the initialization logic circuitry is configured to advance through an initialization phase for each of the physical layer, the link layer, and the transaction layer.

In Example 4, the subject matter of one or both of Examples 2 and 3 optionally include initialization logic circuitry configured to generate a phase enable signal to start an initialization phase, write the initialization data to one or more configuration registers of the I/O channels during the initialization phase, and generate a phase complete signal when the initialization of the layer is completed.

In Example 5, the subject matter of Example 4 optionally includes initialization logic circuitry including at least one control register and at least one status register for the interface layers of the chiplet I/O interface. One or more of the chiplets optionally includes a data communication interface configured to write the at least one control register to enable a phase of the multiple initialization phases, write configuration data into the one or more configuration registers of the I/O channels, detect a phase complete status indicated in the at least one status register, and write the at least one control register to enable a subsequent phase of the multiple initialization phases in response to the detected phase complete status.

In Example 6, the subject matter of Example 5 optionally includes a data communication interface that includes a serial peripheral interface (SPI) and the configuration data is written into the one or more configuration registers using the SPI.

In Example 7, the subject matter of one or any combination of Examples 4-6 optionally includes initialization logic circuitry configured to advance to a configuration state of a phase of the multiple initialization phases in response to an enable signal for the phase, load the initialization data into the one or more configuration registers of the I/O channels during the configuration state, wherein the initialization data is hardware configured, generate a phase complete signal for the phase in response to the loading the initialization data, and generate an enable signal for a subsequent phase of the multiple initialization phases in response to the phase complete signal.

In Example 8, the subject matter of one or any combination of Examples 2-7 optionally includes initialization logic circuitry configured to generate a phase enable signal to start an initialization phase, load initialization data for the I/O channels during the initialization phase, wherein the initialization data is static data configured in circuit hardware, and generate a phase complete signal when the initialization of the layer is completed.

In Example 9, the subject matter of one or any combination of Examples 2-8 optionally includes initialization logic circuitry configured to indicate an initialization phase of the multiple initialization phases to another chiplet, and advance the chiplet to a run state after advancing through the multiple initialization phases.

In Example 10, the subject matter of Example 9 optionally includes initialization circuitry configured to transmit an interface flit using out-of-band signaling to indicate the initialization phase, and a chiplet I/O channel link of the chiplet is configured to transmit a protocol flit when in the run state.

Example 11 includes subject matter (such as a method) or can optionally be combined with one or any combination of Examples 1-10 to include such subject matter, comprising initializing an input-output (I/O) channel interface of multiple chiplets of a chiplet-based system. The intializing includes initializing a first interface layer of the I/O channel interface by loading first initialization data to the first interface layer during a first initialization phase, sequentially initializing other interface layers of the I/O channel interface higher than the first interface layer by loading other initialization data to the higher interface layers during subsequent initialization phases, and enabling a run state of the multiple chiplets after a final initialization phase is completed.

In Example 12, the subject matter of Example 11 optionally includes generating a phase enable signal to start an initialization phase, writing the initialization data to one or more configuration registers of an interface layer during the initialization phase, and generating a phase complete signal when the initialization of the interface layer is completed.

In Example 13, the subject matter of Example 12 optionally includes indicating, by a chiplet, the initialization phase and completion of the initialization phase to the other chiplets using out-of-band signaling.

In Example 14, the subject matter of one or any combination of Examples 11-13 optionally includes initializing a physical layer of the I/O channel interface, and sequentially initializing a link layer and a transaction layer of the I/O channel interface.

In Example 15, the subject matter of one or any combination of Examples 11-14 optionally includes writing, via a communication interface, at least one control register of the I/O channel interface to enable the first initialization phase, writing configuration data into one or more configuration registers of the I/O channel interface, detecting, via the communication interface, a phase complete status indicated in at least one status register of the I/O channel interface, and writing the at least one control register to enable a subsequent initialization phase in response to detecting the phase complete status.

In Example 16, the subject matter of Example 15 optionally includes writing the configuration register into the one or more configuration registers using out-of-band signaling.

In Example 17, the subject matter of one or any combination of Examples 11-16 optionally includes advancing to a configuration state of the first initialization phase in response to an enable signal for the first initialization phase, loading the initialization data for the I/O channels during the configuration state, wherein the initialization data is hardware configured, generating a phase complete signal for the first initialization phase in response to the loading the initialization data, and generating an enable signal for a subsequent initialization phase in response to the phase complete signal.

Example 18 includes subject matter (or can optionally be combined with one or any combination of Examples 1-15 to include such subject matter), such as a computer readable storage medium comprising instructions that, when executed by a system that includes an input-output (I/O) channel interface of multiple chiplets of the system, cause the system to perform operations comprising initializing a first interface layer of the I/O channel interface by loading first initialization data to the first interface layer during a first initialization phase, sequentially initializing other interface layers of the I/O channel interface higher than the first interface layer by loading other initialization data to the higher interface layers during subsequent initialization phases, and enabling a run state of the multiple chiplets after a final initialization phase is completed.

In Example 19, the subject matter of Example 18 optionally includes instructions that cause the system to perform operations including generating a phase enable signal to start an initialization phase, writing the initialization data to one or more configuration registers of an interface layer during the initialization phase, and generating a phase complete signal when the initialization of the interface layer is completed.

In Example 20, the subject matter of one or both of Examples 18 and 19 optionally includes instructions that cause the system to perform operations including initializing a physical layer of the I/O channel interface as the first interface layer, and initializing a link layer and a transaction layer of the I/O channel interface as the other interface layers.

In Example 21, the subject matter of one or any combination of Examples 18-20 optionally includes instructions that cause the system to perform operations including writing, via a communication interface of the system, at least one control register of the I/O channel interface to enable the first initialization phase, writing configuration data into one or more configuration registers of the I/O channel interface, detecting, via the communication interface, a phase complete status indicated in at least one status register of the I/O channel interface, and writing the at least one control register to enable a subsequent initialization phase in response to detecting the phase complete status.

In Example 22, the subject matter of one or any combination of Examples 18-21 optionally includes instructions that cause the system to perform operations including advancing to a configuration state of the first initialization phase in response to an enable signal for the first initialization phase, loading the initialization data into the one or more configuration registers of the I/O channels during the configuration state, wherein the initialization data is hardware configured, generating a phase complete signal for the first initialization phase in response to the loading the initialization data, and generating an enable signal for a subsequent initialization phase in response to the phase complete signal.

In Example 23, the subject matter of one or any combination of Examples 18-22 optionally includes instructions that cause the system to perform operations including transmitting an interface flit using out-of-band signaling by one or more chiplets to indicate an initialization phase, and transmitting a protocol flit one or more chiplet I/O channel links when in the run state.

These non-limiting Examples can be combined in any permutation or combination.

What is claimed is:

1. A system comprising:
    an interposer including at least one interconnect bus; and
    multiple chiplets arranged on the interposer, wherein each chiplet includes:
    multiple chiplet input-output (I/O) channels interconnected to I/O channels of other chiplets through the interposer;
    a chiplet I/O interface for the chiplet I/O channels that includes multiple interface layers; and
    initialization logic circuitry configured to:
    generate a phase enable signal to start an initialization phase;
    load initialization data for the I/O channels during the initialization phase, wherein the initialization data is static data configured in circuit hardware;
    advance initialization of the chiplet interface sequentially through the interface layers starting with a lowest interface layer; and
    generate a phase complete signal when the initialization of the layer is completed.

2. The system of claim 1, wherein the initialization logic circuitry is configured to advance through multiple initialization phases with one interface layer of the chiplet I/O interface initialized by writing initialization data to the chiplet I/O channels during each initialization phase.

3. The system of claim 2, wherein the interface layers of the chiplet I/O interface include a physical layer, a link layer, and a transaction layer, and the initialization logic circuitry is configured to advance through an initialization phase for each of the physical layer, the link layer, and the transaction layer.

4. The system of claim 2, wherein the initialization logic circuitry is configured to write the initialization data to one or more configuration registers of the I/O channels during the initialization phase.

5. The system of claim 4,
    wherein the initialization logic circuitry includes at least one control register and at least one status register for the interface layers of the chiplet I/O interface;
    wherein one or more of the chiplets includes a data communication interface configured to:

write the at least one control register to enable a phase of the multiple initialization phases;
write configuration data into the one or more configuration registers of the I/O channels;
detect a phase complete status indicated in the at least one status register; and
write the at least one control register to enable a subsequent phase of the multiple initialization phases in response to the detected phase complete status.

6. The system of claim 5, wherein the data communication interface includes a serial peripheral interface (SPI) and the configuration data is written into the one or more configuration registers using the SPI.

7. The system of claim 4, wherein the initialization logic circuitry is configured to:
advance to a configuration state of a phase of the multiple initialization phases in response to an enable signal for the phase;
load the initialization data into the one or more configuration registers of the I/O channels during the configuration state, wherein the initialization data is hardware configured;
generate a phase complete signal for the phase in response to the loading the initialization data; and
generate an enable signal for a subsequent phase of the multiple initialization phases in response to the phase complete signal.

8. The system of claim 2, wherein the initialization logic circuitry is configured to:
indicate an initialization phase of the multiple initialization phases to another chiplet; and
advance the chiplet to a run state after advancing through the multiple initialization phases.

9. The system of claim 8,
wherein the initialization circuitry is configured to transmit an interface flit using out-of-band signaling to indicate the initialization phase; and
a chiplet I/O channel link of the chiplet is configured to transmit a protocol flit when in the run state.

10. A method comprising:
initializing an input-output (I/O) channel interface of multiple chiplets of a chiplet-based system, including:
initializing a first interface layer of the I/O channel interface by loading first initialization data to the first interface layer during the first initialization phase;
writing, via a communication interface, at least one control register of the I/O channel interface to enable a first initialization phase;
writing configuration data into one or more configuration registers of the I/O channel interface;
detecting, via the communication interface, a phase complete status indicated in at least one status register of the I/O channel interface; and
writing the at least one control register to enable a subsequent initialization phase in response to detecting the phase complete status
sequentially initializing other interface layers of the I/O channel interface higher than the first interface layer by loading other initialization data to the higher interface layers during subsequent initialization phases; and
enabling a run state of the multiple chiplets after a final initialization phase is completed.

11. The method of claim 10, wherein the sequentially initializing other interface layers includes:
generating a phase enable signal to start an initialization phase;
writing the initialization data to one or more configuration registers of an interface layer during the initialization phase; and
generating a phase complete signal when the initialization of the interface layer is completed.

12. The method of claim 11, including indicating, by a chiplet, the initialization phase and completion of the initialization phase to the other chiplets using out-of-band signaling.

13. The method of claim 10,
wherein the initializing the first interface layer includes initializing a physical layer of the I/O channel interface; and
wherein the sequentially initializing the other interface layers includes sequentially initializing a link layer and a transaction layer of the I/O channel interface.

14. The method of claim 13, wherein writing the configuration data includes writing the configuration register into the one or more configuration registers using out-of-band signaling.

15. The method of claim 10, wherein initializing the first interface layer and the other interface layers includes:
advancing to a configuration state of the first initialization phase in response to an enable signal for the first initialization phase;
loading the initialization data for the I/O channels during the configuration state, wherein the initialization data is hardware configured;
generating a phase complete signal for the first initialization phase in response to the loading the initialization data; and
generating an enable signal for a subsequent initialization phase in response to the phase complete signal.

16. A non-transitory machine-readable medium including instructions that, when executed by a system that includes an input-output (I/O) channel interface of multiple chiplets of the system, cause the system to perform operations comprising:
writing, via a communication interface of the system, at least one control register of the I/O channel interface to enable a first initialization phase;
initializing a first interface layer of the I/O channel interface by loading first initialization data to the first interface layer during the first initialization phase;
writing configuration data into one or more configuration registers of the I/O channel interface;
detecting, via the communication interface, a phase complete status indicated in at least one status register of the I/O channel interface; and
writing the at least one control register to enable a subsequent initialization phase in response to detecting the phase complete status;
sequentially initializing other interface layers of the I/O channel interface higher than the first interface layer by loading other initialization data to the higher interface layers during subsequent initialization phases; and
enabling a run state of the multiple chiplets after a final initialization phase is completed.

17. The non-transitory machine-readable medium of claim 16, including instructions that cause the system to perform operations including:
generating a phase enable signal to start an initialization phase; and
generating a phase complete signal when the initialization of the interface layer is completed.

18. The non-transitory machine-readable medium of claim 17, including instructions that cause the system to perform operations including:
- initializing a physical layer of the I/O channel interface as the first interface layer; and
- initializing a link layer and a transaction layer of the I/O channel interface as the other interface layers.

19. The non-transitory machine-readable medium of claim 17, including instructions that cause the system to perform operations including:
- advancing to a configuration state of the first initialization phase in response to an enable signal for the first initialization phase;
- loading the initialization data into the one or more configuration registers of the I/O channels during the configuration state, wherein the initialization data is hardware configured;
- generating a phase complete signal for the first initialization phase in response to the loading the initialization data; and
- generating an enable signal for a subsequent initialization phase in response to the phase complete signal.

20. The non-transitory machine-readable medium of claim 17, including instructions that cause the system to perform operations including:
- transmitting an interface flit using out-of-band signaling by one or more chiplets to indicate an initialization phase; and
- transmitting a protocol flit one or more chiplet I/O channel links when in the run state.

* * * * *